United States Patent [19]
Goth et al.

[11] Patent Number: 5,699,853
[45] Date of Patent: Dec. 23, 1997

[54] COMBINED HEAT SINK AND SINK PLATE

[75] Inventors: Gary Franklin Goth, Pleasant Valley; Randall Gail Kemink, Poughkeepsie; John Joseph Loparco, Poughkeepsie; Roger Ray Schmidt, Poughkeepsie, all of N.Y.

[73] Assignee: International Business Machines Corporation, Armonk, N.Y.

[21] Appl. No.: 697,806

[22] Filed: Aug. 30, 1996

[51] Int. Cl.⁶ .................................... F28D 15/00
[52] U.S. Cl. ...................... 165/104.21; 165/104.33; 165/185; 361/700
[58] Field of Search .............. 165/104.33, 80.3, 165/104.26, 185, 104.21; 361/697, 696, 700, 692

[56] References Cited

U.S. PATENT DOCUMENTS

| | | | |
|---|---|---|---|
| 4,421,156 | 12/1983 | Vaubel et al. | 165/1 |
| 4,588,023 | 5/1986 | Munekawa | 165/104.33 |
| 4,660,132 | 4/1987 | Basler et al. | 165/104.33 X |
| 4,675,783 | 6/1987 | Murase et al. | 165/104.14 X |
| 4,884,631 | 12/1989 | Rippel | 361/697 X |
| 4,921,039 | 5/1990 | Ghiraldi | 165/104.33 X |
| 4,921,043 | 5/1990 | Ghiraldi | 165/104.33 X |
| 4,941,530 | 7/1990 | Crowe | 165/104.33 |
| 5,199,165 | 4/1993 | Crawford et al. | 165/104.33 X |
| 5,213,153 | 5/1993 | Itoh | 165/104.33 |
| 5,216,580 | 6/1993 | Davidson et al. | 165/104.33 X |
| 5,289,869 | 3/1994 | Klein et al. | 165/32 |
| 5,343,940 | 9/1994 | Jean | 165/104.33 |
| 5,413,167 | 5/1995 | Hara et al. | 165/86 |
| 5,535,816 | 7/1996 | Ishida | 165/104.33 X |

*Primary Examiner*—John Rivell
*Assistant Examiner*—Christopher Atkinson
*Attorney, Agent, or Firm*—Lawrence D. Cutter

[57] ABSTRACT

A heat sink with fins that extend between first and second conductive plates is cooperatively combined with one or more heat pipes which act to directly transfer heat to an otherwise relatively inefficiently used portion of the cooling fins.

10 Claims, 2 Drawing Sheets

COMBINED HEAT SINK AND SINK PLATE

BACKGROUND OF THE INVENTION

The present invention is generally directed to devices used to remove heat from electronic circuit packages. More particularly, the present invention is directed to a heat sink used in combination with a heat pipe to provide greater cooling efficiency than either device alone.

With increases in electronic circuit chip density, as measured in circuit's per unit area, there has also been produced a corresponding increase in thermal energy which must be removed from these chip devices particularly when they are run at ever increasing frequencies. As the clock frequency increases, the corresponding heat generated also grows. Accordingly, heat flux levels in these devices have increased dramatically in recent years.

Accordingly, it is seen that there is a significant problem in the removal of sufficient heat from densely packed electronic modules. Moreover, it is particularly desirable to be able to do this, as much as possible, without resorting to water cooled technologies. Conventional heat sinks, however, are limited in their capabilities even if one employs heat sinks with taller fin structures. Such heat sinks are limited because, with longer fins, the efficiency drops quickly because little heat reaches the fin tips.

Heat pipes have also been suggested for utilization in the cooling of electronic circuit modules. See, for example, U.S. Pat. No. 5,216,580, issued Jun. 1, 1993, to Davidson et al. and U.S. Pat. No. 5,289,869, issued Mar. 1, 1994, to Klein et al. However, heat pipes have severe practical limitations when applied to the problem of cooling high-power logic modules. In particular, there is considerable difficulty in physically mating the heat pipe to an associated electronic circuit module. The result is that neither the heat sink technology nor the heat pipe technology has been able, by itself, to provide desired levels of cooling, particularly for high-power, multi-chip modules which have traditionally required water cooling. While water cooling is a thermally effective mechanism, it is nonetheless a technology that increases the complexity of the system.

SUMMARY OF THE INVENTION

In accordance with a preferred embodiment of the present invention, a heat sink comprises a first thermally conductive plate and a second thermally conductive plate which is disposed substantially parallel to the first plate. There is also included a plurality of fins which extend between the first and second plates and is in thermal contact with both of them. There is also present at least one heat pipe which thermally connects the first and second plates. In one preferred embodiment of the present invention, the heat pipes are U-shaped and are disposed in holes disposed horizontally in the first and second plates. The U-shaped heat pipes may be inserted from the ends or the sides of the heat sink structure. In one embodiment, a heat pipe extends upwards through the center of the array of fins.

An essential problem that is associated with the utilization of heat sinks having fin structures or air cooling is that for high-power applications one wants as large a fin area as possible. However, because of the typical chip packaging arrangement, the fin area cannot be increased significantly because the base area of the heat sink is already predetermined by the size of the chip or module that the heat sink is cooling. Accordingly, it is only possible to increase the fin area by making the fins longer or by decreasing the spacing between fins. However, there is a limit to which the spacing between fins can be shrunk. In particular, if the fin spacing is too small, it becomes difficult to drive air or other cooling fluid between the fins. Accordingly, most efforts at increasing fin area have been directed to providing heat sink structures with taller fins. However, even this solution has its limits in that the upper fin areas are not used as efficiently because they do not get as hot and, accordingly, the temperature differences between the upper fin area and the ambient cooling air is smaller. It is, therefore, seen that it is desirable to directly move some of the heat generated in the first or lower plate directly to an upper plate to which the fins are attached at the opposite (cooler) end of the heat sink. The present invention achieves this direct heat transfer and, accordingly, provides a structure and apparatus which renders upper fin areas more efficient.

Accordingly, it is an object of the present invention to combine heat sink and heat pipe technology into a single heat sink structure which is more efficient.

It is a further object of the present invention to provide improved cooling mechanisms for electronic circuit chips and multi-chip circuit modules.

It is yet another object of the present invention to provide a heat sink for cooling electronic circuits which employs readily available technology and which can be implemented at a relatively low cost.

It is a still further object of the present invention to provide heat sink assemblies and structures which comprise conventional material such as copper and aluminum thus avoiding the necessity to use other more expensive technologies in their construction.

It is also an object of the present invention to cool electronic circuit chip parts and boards using an air cooling system as opposed to a water cooling system.

It is a still further object of the present invention to be able to increase the density of circuit chips as measured in devices per unit area without resorting to water cooling methods.

It is also an object of the present invention to be able to operate electronic circuit chip devices at increased frequency.

It is also an object of the present invention to provide a mechanism for exploiting the useful properties of heat pipes in electronic circuit chip and module cooling while at the same time avoiding expensive technologies associated with matching heat pipes to semiconductor devices.

Lastly, but not limited hereto, it is an object of the present invention to combine heat sink and heat pipe technologies in a cooperative and complementary fashion to produce a heat removal solution with a combination of technologies achieving performance advantages far beyond the capabilities of either technology separately.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
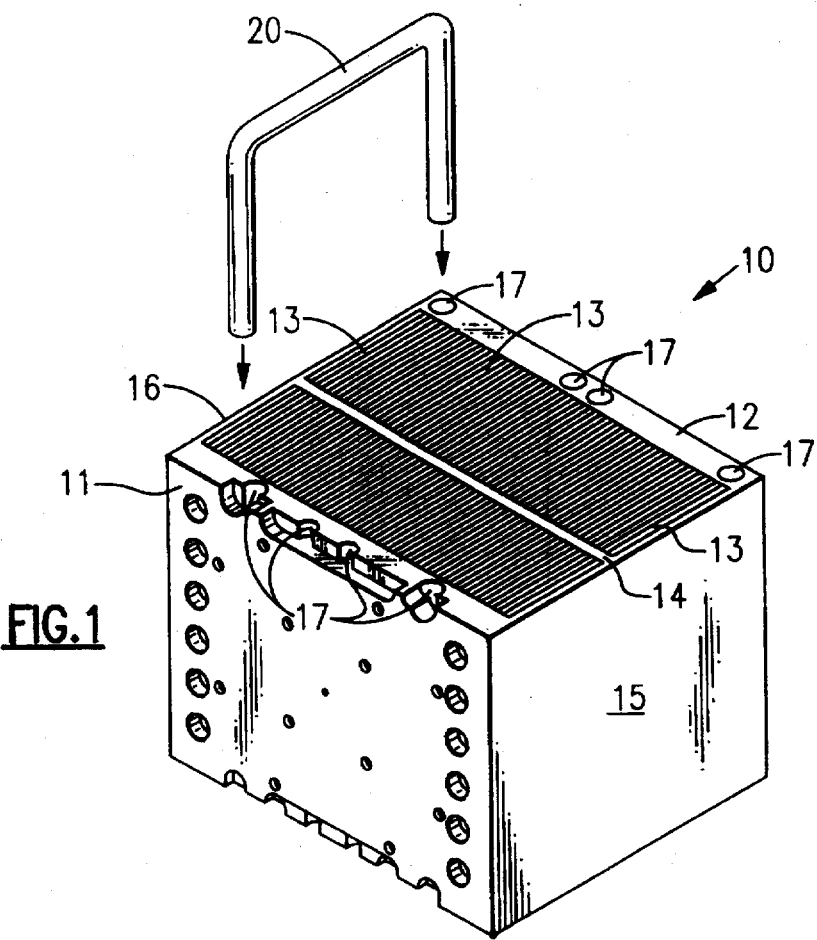
FIG. 1 is an isometric view illustrating a preferred embodiment of the present invention.

FIG. 1 illustrates one embodiment of the present invention in which a first or bottom thermally conductive plate 11 is provided for intimate thermal contact with chips, modules or multi-chip modules from which heat is to be removed. A second thermally conductive plate 12 is disposed substantially parallel to lower plate 11 to which it is thermally connected by means of a plurality of substantially parallel fins 13. Rigidity may be provided or enhanced by the presence of side plates 15 and 16 which are also typically substantially parallel to fin array 13. Fins 13 may also be in thermal contact with intermediate support plate 14 which extends from plate 15 to plate 16. The plate and fin structures 11, 12, 13, 14, 15 and 16 preferably comprise a thermally conductive material such as copper or aluminum. While these metals may both be employed in the same heat sink apparatus, it is generally desirable that dissimilar metals not be employed in contact with one another. This precaution is usually taken to prevent electrochemically-driven corrosion.

Lower plate 11 also includes channels 17 therein into which heat pipe 20 is snugly inserted. Similar channels 17 are provided in upper or second thermally conductive plate 12. Generally, U-shaped heat pipe 20 is inserted into tubular channels 17 in upper and lower plates 11 and 12, respectively. The particular embodiment shown in FIG. 1 provides for the inclusion of up to four heat pipes. However, the number employed is a matter of design choice.

It is seen in FIG. 1 that there is provided a combined heat sink and heat pipe technology which is employed to achieve performance far beyond the capability of either device separately. All of the performance advantages provided by a dense heat sink are provided. However, by utilizing a heat pipe to transport up to 40% of the heat to the top of the heat sink, effective utilization of the upper fin region is dramatically improved. In fact, the net performance is improved almost to the same level that can be achieved by using a closed looped water-based cooling system. However, the present system avoids pumps, leaks and other problems associated with closed loop water systems.

In the arrangement shown in FIG. 1, the heat pipes are U shaped and only require holes to be drilled in the base and top sections of heat sink 10 (that is, in plates 11 and 12). Heat pipe 20 may, in fact, comprise any suitably bent commercial heat pipe. While the embodiments shown in FIGS. 1 and 2 work in all orientations, optimum performance is achieved when the module contacting thermal surface is physically beneath the top of the heat sink (that is, below plate 12).

In some instances, improved performance is achieved by having the heat pipes extend up through the center of the heat sink and laying across the top fins. This is not, however, the preferred embodiment. It is possible to keep gravity in one's favor using this approach which better distributes the heat across the fins. It is also noted that fins may be placed directly on the heat pipes themselves for improved performance. Heat pipes may be included so as to either exit the ends of the heat sink or come up through the center of the heat sink depending upon the desired application. Heat sink configurations shown in FIGS. 1 and 2 work well with both copper and aluminum or a combination of materials. However, as pointed out above, the use of dissimilar metals is not a preferred embodiment. It is also particularly noted that the invention, as shown in FIGS. 1 and 2, is such that, in normal cooling operations, air is either permitted to flow through fin array 13 or, in fact, is deliberately directed through them by means of an appropriate air moving device.

Figure 2:
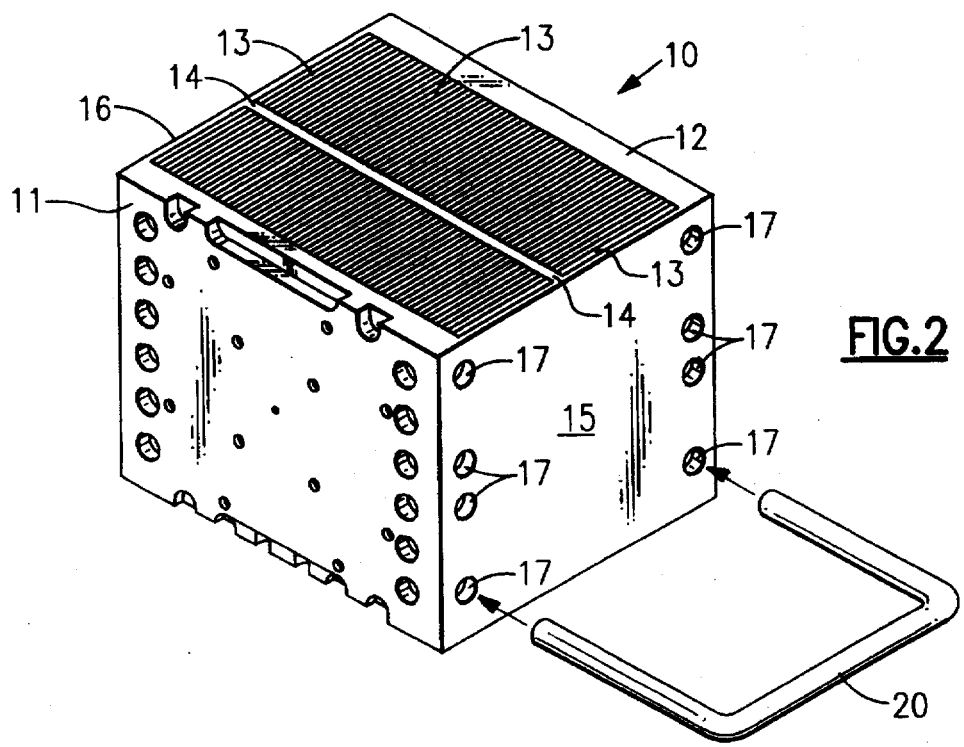
FIG. 2 is an isometric view, similar to FIG. 1, illustrating an alternative embodiment of the present invention.
Figure 3:
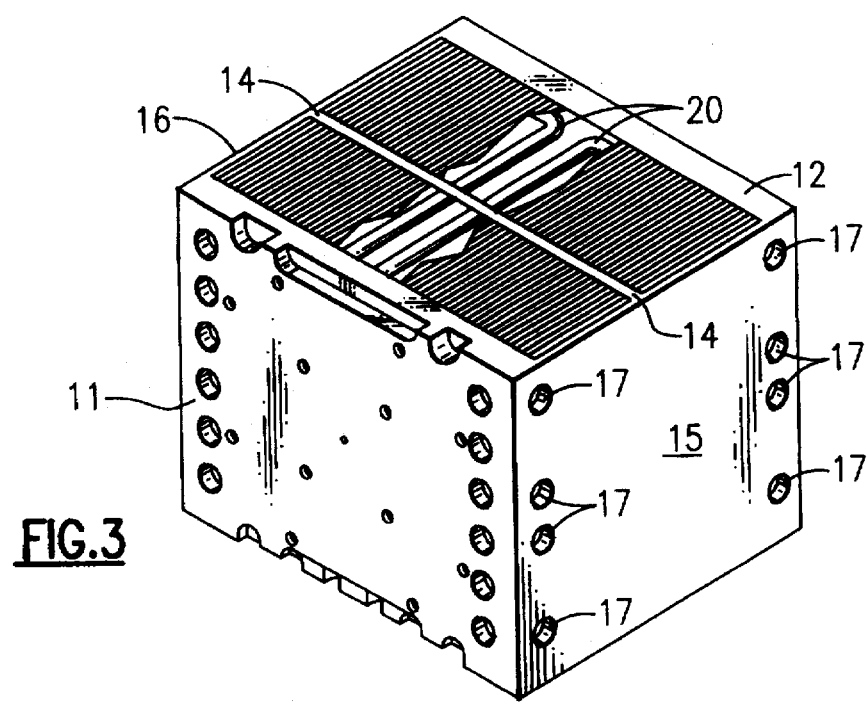
FIG. 3 is an isometric view similar to FIG. 1 illustrating an embodiment of the present invention in which heat pipes extend up through the center of the heat sink.
Figure 4:
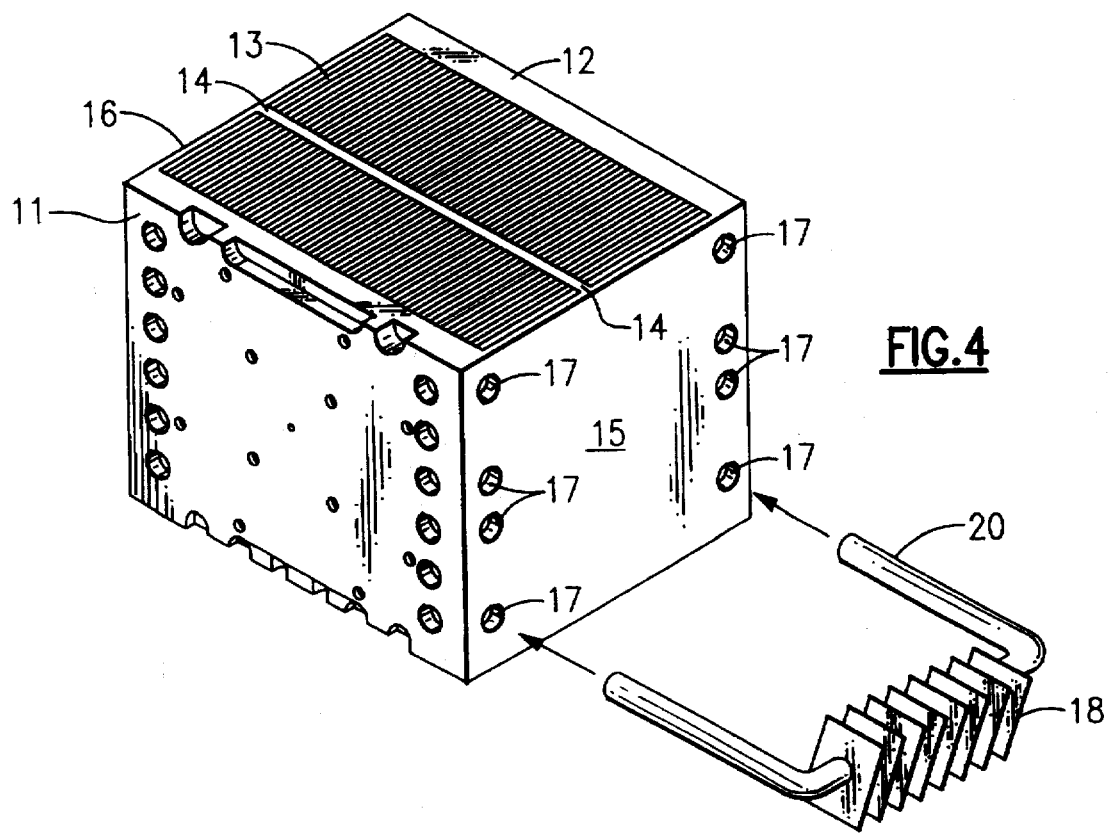
FIG. 4 is an isometric view similar to FIG. 1 illustrating the presence of fins on the heat pipes.

FIG. 2 illustrates an alternate embodiment of the present invention in which heat pipes 20 are disposed through the sides of the heat sink structure. This arrangement is advantageous where it is desirable to limit obstructions to the flow of air through fin array 13. It should also be particularly noted that while FIGS. 1 and 2 illustrate heat sinks 20 being inserted from only one side of the heat sink structure, it is also considered to be within the scope of the present invention to have heat pipes on both sides or both ends of the heat sink structure. Furthermore, if plates 11 and 12 are thick enough, it is also possible to have heat pipes present on both the sides and ends of the heat sink structure.

From the above, it should be appreciated that the present invention fully satisfies all of the objectives set out above. In particular, it is seen that FIGS. 1 and 2 both illustrate embodiments of the present invention in which heat sink and heat pipe technologies are combined in a fashion in which a cooperative relationship is provided which optimizes the heat removal capacities of the upper portion of the fin array which is located furthest from plate 11 which is in contact with the device to be cooled. It is further seen that the mated technologies cooperate well together and result in a structure which requires minimal amounts of additional tooling to produce. Thus, the resulting structure is not only efficient, it is economical and readily producible. That is to say, the production of the present invention does not require any additional invention or the development of other technologies.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A heat sink comprising:
    a first thermally conductive plate;
    a second thermally conductive plate disposed substantially parallel to said first plate;
    an array of substantially parallel thermally conductive fins extending between said first and second plates, said fins being in direct thermal contact with said first and second plates; and
    at least one heat pipe thermally connecting said first and second plates.

2. The heat sink of claim 1 in which said heat pipe is U-shaped.

3. The heat sink of claim 1 in which said at least one heat pipe is inserted into channels in said first and second thermally conductive plates.

4. The heat sink of claim 1 in which said first thermally conductive plate comprises a material selected from the group consisting of copper and aluminum.

5. The heat sink of claim 1 in which said second thermally conductive plate comprises a material selected from the group consisting of copper and aluminum.

6. The heat sink of claim 1 in which there are four heat pipes present.

7. The heat sink of claim 1 in which said at least one heat pipe is U-shaped and lies substantially in a plane parallel to said fins.

8. The heat sink of claim 1 in which said at least one heat pipe is U-shaped and lies in a plane substantially perpendicular to said fins.

9. The heat sink of claim 1 further including additional fins disposed on said at least one heat pipe.

10. The heat sink of claim 1 in which said at least one heat pipe extends from said first plate to said second plate through said fin array.

* * * * *